(12) United States Patent (10) Patent No.: US 8,711,564 B2
Krasnov (45) Date of Patent: Apr. 29, 2014

(54) METHOD AND SYSTEM FOR COOLING OF INTEGRATED CIRCUITS

(75) Inventor: Yuriy K. Krasnov, Richmond Hts., OH (US)

(73) Assignee: Qualitics, Inc, Cleveland, OH (US)

( * ) Notice: Subject to any disclaimer, the term of this patent is extended or adjusted under 35 U.S.C. 154(b) by 195 days.

(21) Appl. No.: 13/374,780

(22) Filed: Jan. 13, 2012

(65) Prior Publication Data

US 2012/0195006 A1 Aug. 2, 2012

Related U.S. Application Data

(60) Provisional application No. 61/462,208, filed on Jan. 31, 2011.

(51) Int. Cl.
*H05K 7/20* (2006.01)

(52) U.S. Cl.
USPC .......................................... 361/699; 361/719

(58) Field of Classification Search
None
See application file for complete search history.

(56) References Cited

U.S. PATENT DOCUMENTS

| | | | | |
|---|---|---|---|---|
| 3,917,370 A | * | 11/1975 | Thornton et al. | 439/194 |
| 5,067,047 A | * | 11/1991 | Azar | 361/691 |
| 5,092,781 A | * | 3/1992 | Casciotti et al. | 439/62 |
| 5,509,468 A | * | 4/1996 | Lopez | 165/144 |
| 5,982,616 A | * | 11/1999 | Moore | 361/679.47 |
| 6,771,500 B1 | * | 8/2004 | Siegel et al. | 361/699 |
| 7,042,723 B2 | * | 5/2006 | Espersen et al. | 361/699 |
| 7,251,138 B2 | * | 7/2007 | Hornung et al. | 361/704 |
| 8,044,506 B2 | * | 10/2011 | Yun et al. | 257/714 |
| 2008/0163631 A1 | * | 7/2008 | Campbell et al. | 62/175 |

* cited by examiner

*Primary Examiner* — Gregory Thompson

(57) ABSTRACT

A system of motherboard, socket and convective cooling cells is providing cooling of both sides—top and bottom—of an integrated circuit, which keeps the temperature deviation inside circuit up to 4 times lower and is up to 4 times more efficient than at the cooling of the same circuit from only one of its side.

2 Claims, 7 Drawing Sheets

METHOD AND SYSTEM FOR COOLING OF INTEGRATED CIRCUITS

BACKGROUND OF THE INVENTION

1. Field of the Invention

The present invention relates generally to an apparatus for and a method of cooling of heat generating integrated circuits in computers and other devices, and is presented under priority of invention claimed in the Provisional patent Application US 61/462,208 filed Jan. 31, 2011.

2. Description of the Related Art

The problem of cooling integrated circuits in computers and other devices now became a main factor that restricts progress in the industry. Further increase of the frequency of processors is impossible because of accompanied heat generation leads to a very fast rise of the temperature inside the circuit that destroys it. That is why methods and systems of cooling of the modern integrated circuits are the most actual demand of the industry. Currently there are a lot convective cooling systems on the market; all of them are based on schematics of an attachment of cooled integral chip (for instance—CPU) as it is shown in FIG. 1, and all of them are based on the one side cooling of the integrated circuits of computers.

Present invention provides method and system for both sides cooling of CPUs and other chips of PC that allows doubling, at least, the efficiency of chilling those important elements of PC.

SUMMARY OF THE INVENTION

It is an object of the present invention to teach a means of using of the all profound features of the both surface—top and bottom—cooling method for cooling of the integrated circuits in PC and other devices that are generating a high level of the heat power.

BRIEF DESCRIPTION OF THE DRAWINGS

Advantages and features of the present invention are better understood with reference to the following and more detailed description and claims taken in conjunction with accompanying drawings, in which like elements are identified with like symbols.

DESCRIPTION OF THE PREFERRED EMBODIMENTS

Actually any attachment of any cooling system to both surfaces of heat generating integrated circuits will be a practical embodiment of the main idea of present invention. But the best mode for carrying out the invention is presented in terms of its preferred embodiment, herein depicted within the Figures.

A preferred embodiment of the present invention is the implementation of the convective water cooling phenomenon for cooling of CPU in PC.

Figure 1:
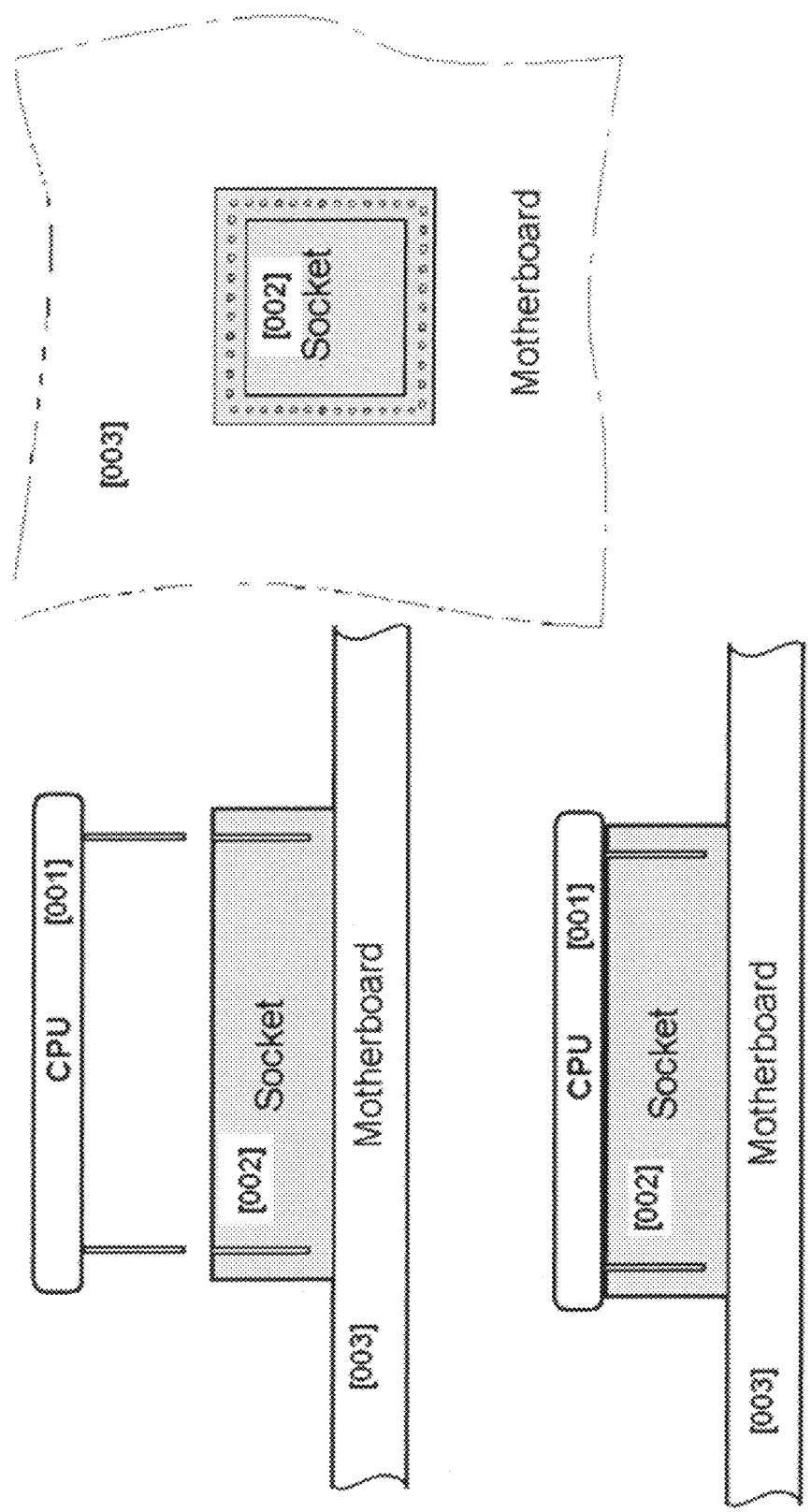
FIG. 1 shows a schematic of contemporary system of attachment of CPU to the motherboard through special socket.

The contemporary method and system of attachment of CPU to the motherboard of PC is shown schematically in FIG. 1. Contemporary CPU [001] is a proper integrated circuit made in shape of a rectangular body with an appropriate set of electrical contacts—the pins that are ranged all over perimeter of the bottom of CPU. Each of those pins has to be brought to a contact with appropriate beginning of circuit stamped on the motherboard. For that the special socket is used. Contemporary socket [002] actually is made as a proper table which has the appropriate set of electrical holes that are exactly matching to the set of pins of CPU from one side, and can be soldered to the beginning points of circuit on the motherboard, on the other side. The socket is attached to the motherboard [003] and ends of its electric holes are soldered to the corresponding beginning points of circuit on this motherboard. Then CPU can be brought to the position when each of its pins is exactly matching to the corresponding hole on the socket and CPU can be gently pushed down until it will sit on the top surface of socket as on the table; the pins become in full electric contact with needed holes in the socket and through them—with the corresponding beginnings of circuits on the motherboard. To insure reliability of such contact different kind of clips are used, which fasten CPU to the socket.

For the implementation of the present invention two modifications should be done.

Figure 2:
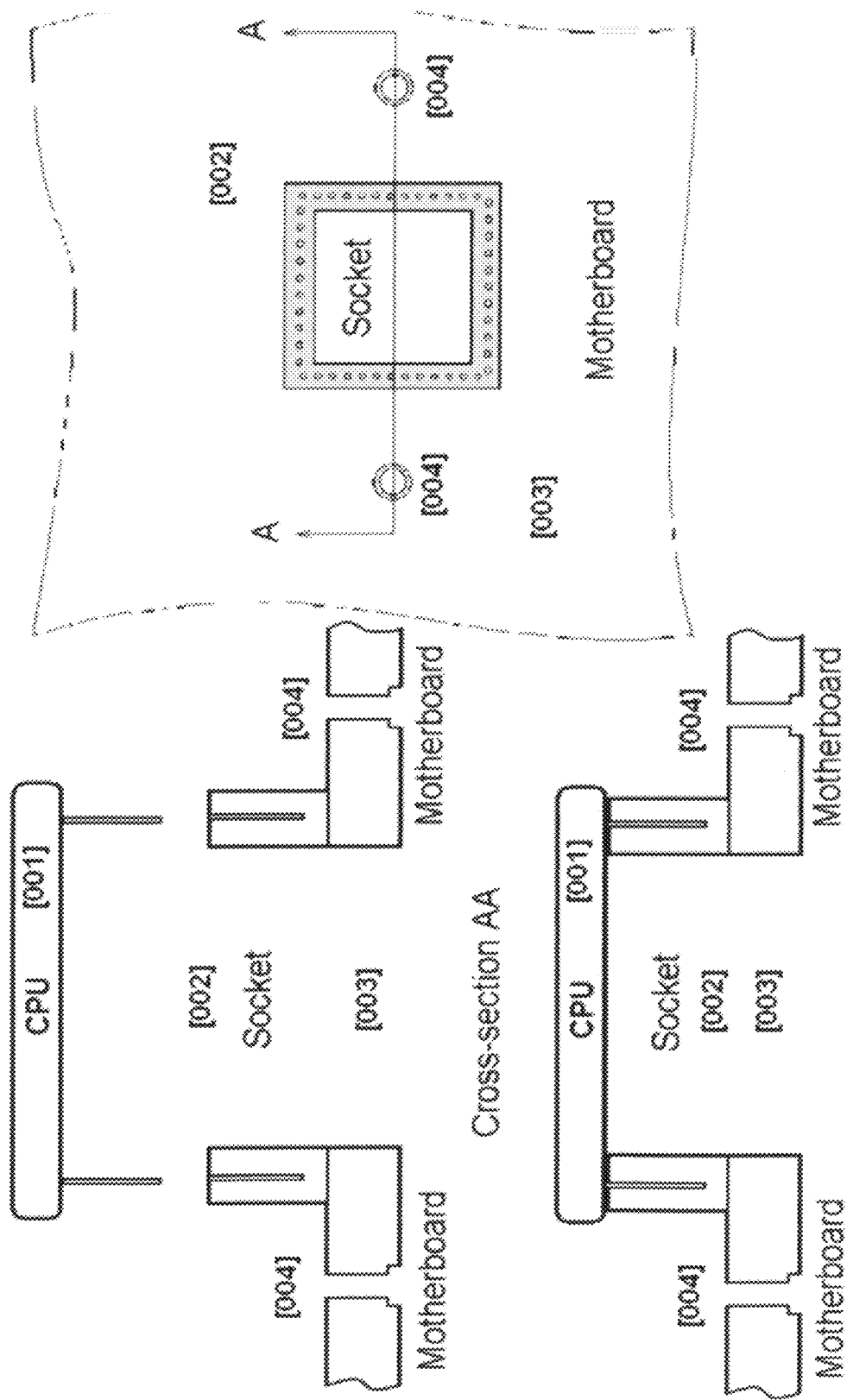
FIG. 2 shows a schematic of some modernization of socket and motherboard that should be done to adapt the invention.

First of all, the socket [002] should be made hollowed, i.e. the central part of its top surface, which is playing the role of table on which CPU's central part is laying, should be eliminated, as FIG. 2 is showing. So that socket [002] shall be not a table, but a hollowed rectangular pedestal for CPU, which provides free access to the bottom of CPU (its central part that is out of pins area).

Secondly, the matching rectangular hole should be made in the motherboard [003].

And finally, appropriate 2 circular holes [004] should be made for coolant channels in the motherboard, just as it is illustrated in FIG. 2.

If just described modifications of motherboard and socket are done, the implementation of present invention consists of following.

Figure 3:
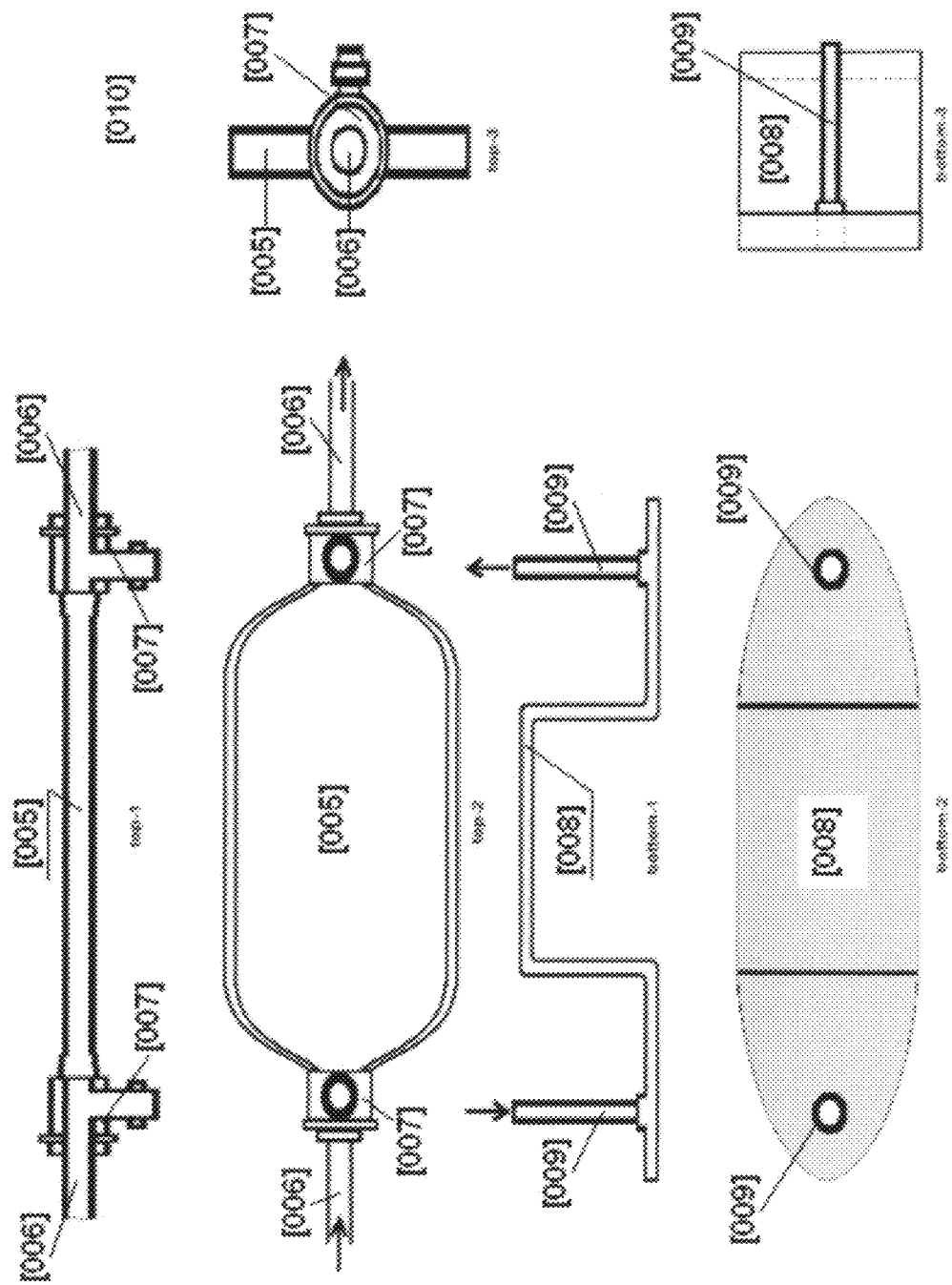
FIG. 3 shows a schematic of top cooling cell and the bottom cooling cell.
Figure 4:
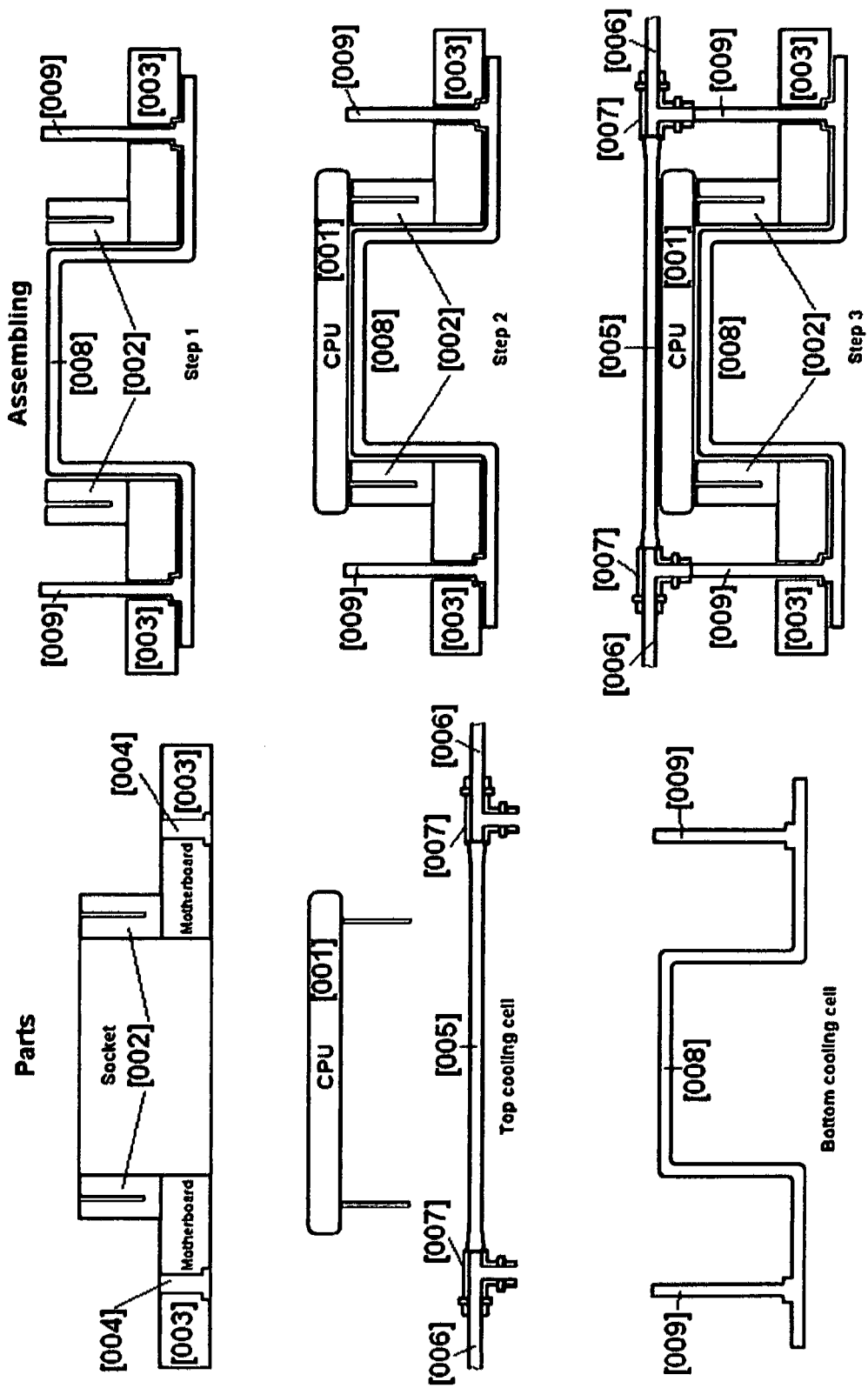
FIG. 4 shows a schematic of assembling of cooling system for CPU.

Two convective cooling cells should be used (see FIG. 3). The top cooling cell [005], which has a bottom surface totally prepared to be suited on the top surface of CPU in full thermal contact (may be with usage of an appropriate grease), is connected with inflow and outflow channels [006] of a fluid coolant through 3way-couplers [007] that allow also connection with tubes [009] that are passing coolant to the bottom cooling cell [008], as it is shown in FIG. 4 (top parts). The bottom cooling cell [008], which has a top surface in its middle area totally prepared to hold the bottom surface of CPU in full thermal contact (may be with usage of an appropriate grease), is made in the shape of pedestal (see part "bottom-I" in FIG. 3) central part of which exactly matches the rectangular hole that is made if the motherboard, and has attached two tubes that can be precisely pushed through two holes [004] that are made in the motherboard, as it is shown in FIG. 3 (bottom parts).

The assembling of invented cooling system goes according to FIG. 4 that shows step by step assembly procedures. Because used 3way-couplers [007] are providing not only reliable hydraulic insulation of cooling cells connection to the external channels for coolant, but they also providing reliable mechanical contacts of CPU with cooling surfaces of both cooling cells, so that there is no need of using any additional mountings.

Figure 5:
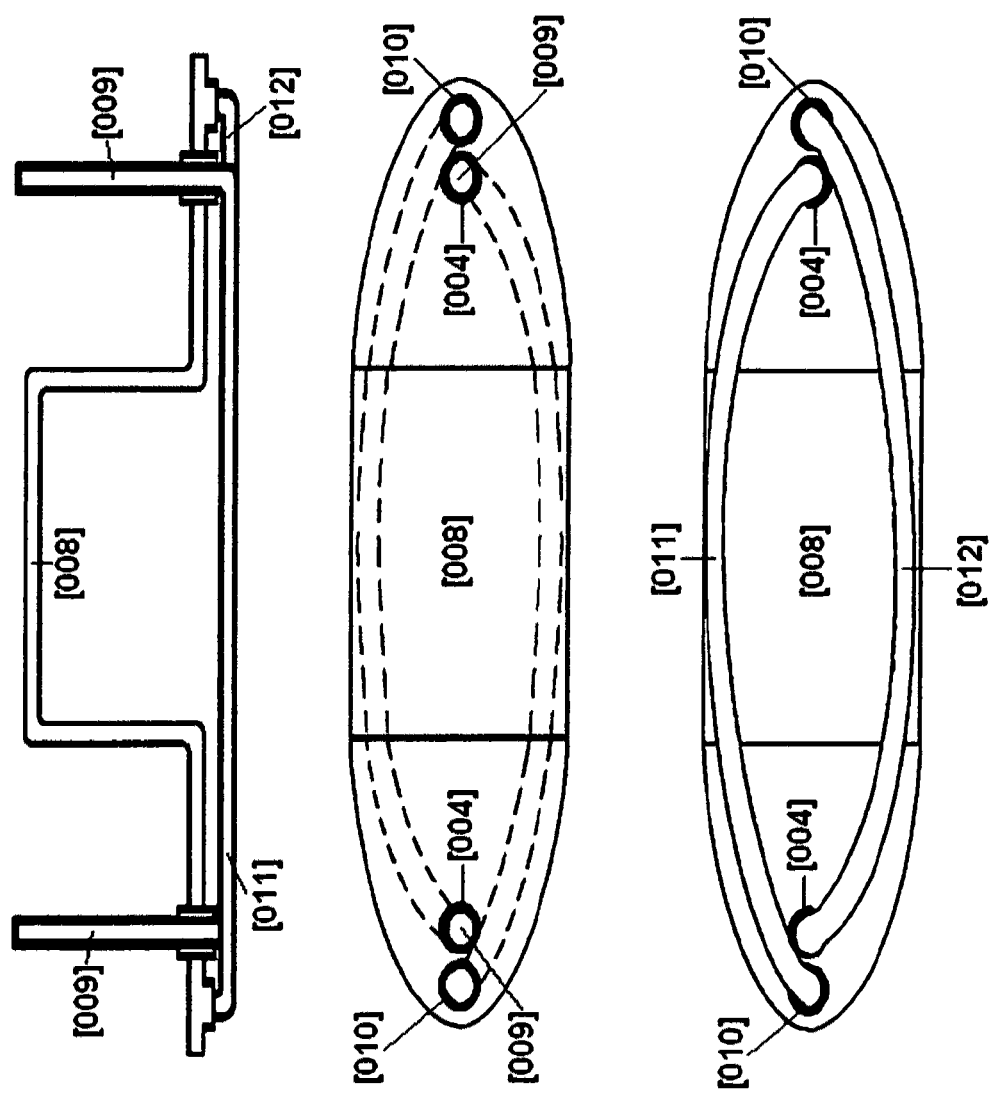
FIG. 5 shows a schematic of the bottom cooling cell for counter-flow cooling system.
Figure 6:
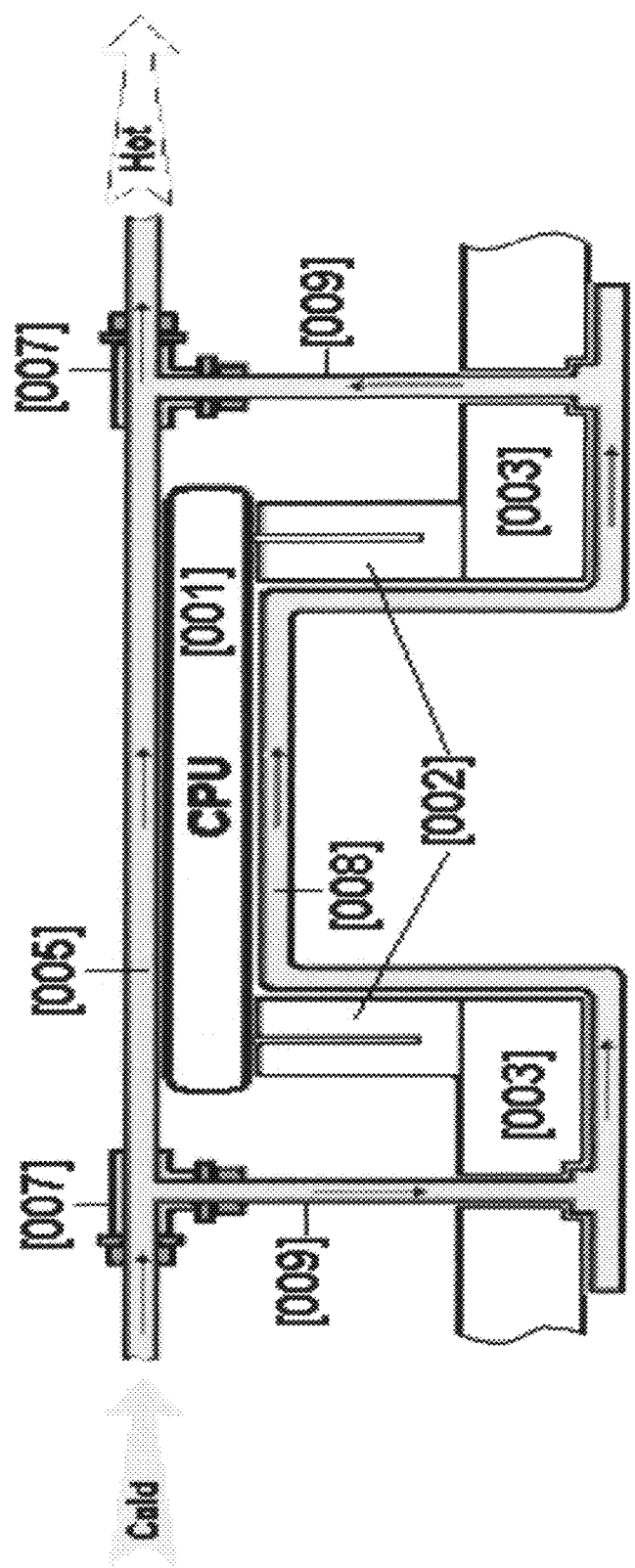
FIG. 6 shows a schematic of the entire cooling block for co-flow cooling
Figure 7:
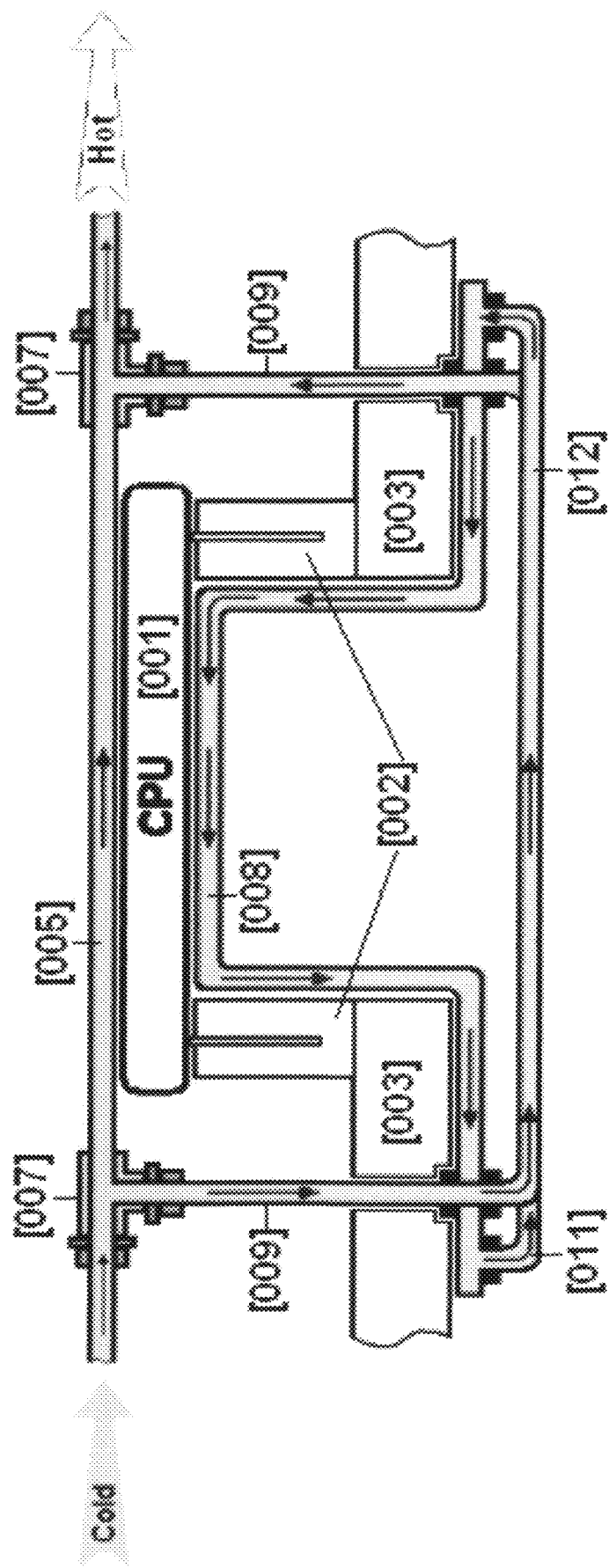
FIG. 7 shows a schematic of the entire cooling block for counter-flow cooling

In just described embodiment the coolant in both cooling cells is flowing in the same direction (see FIG. 6). In another embodiment, the invented convective cooling cell [008] can be assembled in such a way that coolant will flow in opposite directions in the top and in the bottom cells, i.e. this embodiment is realizing counter flow convective cooling of the surfaces of an integrated circuit. For that purpose the bottom cooling cell is designed in the same way, as in FIG. 3, but with two additional through holes [010], as it FIG. 5 illustrates. These holes are allowing feeding tubes [011] and [012] to go to the opposite site of the bottom cooling cell [008] to provide a counter-flow regime of propagation of the stream of coolant, as it is illustrated in FIG. 7.

The foregoing descriptions of specific embodiments of the present invention are presented for purposes of illustration and description. They are not intended to be exhaustive or to limit the invention to precise forms disclosed and, obviously, many modifications and variations are possible in light of the above teaching. The embodiments are chosen and described in order to best explain principles of the invention and its practical application, to thereby enable others skilled in the art to best utilize the invention and its various embodiments with various modifications as are suited to the particular use contemplated. It is intended that a scope of the invention be defined broadly by the Drawings and Specification appended hereto and to their equivalents Therefore, the scope of the invention is in no way to be limited only by the following exemplary claims nor by any possible, adverse inference under the rulings of *Warner-Jenkins Company, v. Hilton Davis Chemical*, 520 US 17 (1997) or *Festo Corp. V. Shoketsu Kinzoku Kogyo Kabushiki Co.*, 535 U.S. 722 (2002), or other similar case law or subsequent precedent should not be made if such claims are amended subsequent to this Provisional Patent Application.

Having thus described the invention what is claimed as new and desired to be granted a patent is as follows:

1. A convective cooling system, that being in a good thermal contact with top and bottom surfaces of internally heated integrated circuit that is placed on an appropriate socket which connects this integrated circuit with circuit on an appropriate motherboard, comprising:

a top cooling cell, whose bottom external surface can be brought in good thermal contact with the top surface of the heated integral circuit, and which is connected with external tubes for inflowing and discharging coolant by two appropriate 3-way couplers;

a bottom cooling cell, which is shaped in the form of pedestal in its middle part whose top external surface can be brought in a good thermal contact with the bottom surface of the heated integral circuit, and which can be connected with said 2 appropriate 3-way couplers by external tubes for inflowing and discharging of coolant;

a hollowed socket for a connection of the integrated circuit with a motherboard, which is allowing a freely reaching of the bottom surface of the integral circuit that is placed on said socket;

a motherboard to which said socket is attached and become electrically connected to the circuits existing on the motherboard, which has a rectangular hole in it that is exactly matching to the hole into a socket for a free access to the bottom surface of the integrated circuit that could be placed on the socket, and 2 holes for the tubes, through which the coolant can be delivered from one of said two 3-way couplers to the bottom cooling cell and discharged from the bottom cooling cell to the second of said two 3-way couplers;

wherein the holes in the socket and motherboard and pedestal-like shape of the bottom cooling cell are made in such a way that assembling all said parts of system provides not only reliable thermal contact of all coincided surfaces, not only reliable hydraulic insulations of all channels that are streamlined by the coolant, but a stable and reliable mechanical strength of entire construction.

2. The system of claim 1 wherein the bottom cooling cell provides the counter-flow of coolant in regard to its flow in the top cooling cell, due to two additional tubes that are delivering coolant to and evacuating it from the opposite ends of the bottom cell.

* * * * *